(12) United States Patent
Okita et al.

(10) Patent No.: US 11,342,418 B2
(45) Date of Patent: May 24, 2022

(54) SILICON CARBIDE SUBSTRATE

(71) Applicant: Sumitomo Electric Industries, Ltd., Osaka (JP)

(72) Inventors: Kyoko Okita, Osaka (JP); Tsubasa Honke, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 176 days.

(21) Appl. No.: 16/770,151

(22) PCT Filed: Sep. 28, 2018

(86) PCT No.: PCT/JP2018/036315
§ 371 (c)(1),
(2) Date: Jun. 5, 2020

(87) PCT Pub. No.: WO2019/111507
PCT Pub. Date: Jun. 13, 2019

(65) Prior Publication Data
US 2020/0388683 A1    Dec. 10, 2020

(30) Foreign Application Priority Data

Dec. 8, 2017  (JP) .............................. JP2017-236405

(51) Int. Cl.
*H01L 29/16*      (2006.01)
*C30B 29/36*      (2006.01)

(52) U.S. Cl.
CPC .......... *H01L 29/1608* (2013.01); *C30B 29/36* (2013.01)

(58) Field of Classification Search
CPC ........................... C30B 29/36; H01L 29/1608
See application file for complete search history.

(56) References Cited

U.S. PATENT DOCUMENTS

| | | | |
|---|---|---|---|
| 2008/0170289 A1* | 7/2008 | Rice | ..................... H01S 3/30 |
| | | | 359/334 |
| 2013/0137198 A1 | 5/2013 | Honke et al. | |
| | (Continued) | | |

FOREIGN PATENT DOCUMENTS

| | | |
|---|---|---|
| JP | 2013-112575 A | 6/2013 |
| JP | 2014-210690 A | 11/2014 |
| | (Continued) | |

*Primary Examiner* — Jaehwan Oh
(74) *Attorney, Agent, or Firm* — Faegre Drinker Biddle & Reath LLP

(57) ABSTRACT

Prescribed mathematical expressions are satisfied, where $v_0$ represents a wave number indicating a peak corresponding to a folded mode of a longitudinal optical branch of a Raman spectrum of silicon carbide having a polytype of 4H and having zero stress, $v_{max}$ represents a maximum value of a wave number indicating a peak corresponding to a folded mode of a longitudinal optical branch of a Raman spectrum of a silicon carbide substrate in a region from a first main surface to a second main surface, $v_{max}$ represents a minimum value of the wave number indicating the peak corresponding to the folded mode of the longitudinal optical branch of the Raman spectrum, and $v_1$ represents a wave number indicating a peak corresponding to a folded mode of a longitudinal optical branch of a Raman spectrum of the silicon carbide substrate at the first main surface.

3 Claims, 10 Drawing Sheets

(56) References Cited

U.S. PATENT DOCUMENTS

| | | |
|---|---|---|
| 2014/0315373 A1 | 10/2014 | Okita |
| 2016/0231256 A1 | 8/2016 | Kojima et al. |
| 2016/0300910 A1 | 10/2016 | Kudou |
| 2018/0254323 A1 | 9/2018 | Ueta et al. |
| 2018/0282902 A1 | 10/2018 | Nakabayashi |

FOREIGN PATENT DOCUMENTS

| | | |
|---|---|---|
| JP | 2015-059073 A | 3/2015 |
| JP | 2016-199462 A | 12/2016 |
| JP | 2017-075074 A | 4/2017 |
| WO | WO-2017/057742 A1 | 4/2017 |

* cited by examiner ature of 4H, $\nu_{max}$ rep
SILICON CARBIDE SUBSTRATE

TECHNICAL FIELD

The present disclosure relates to a silicon carbide substrate. The present application claims priority to Japanese Patent Application No. 2017-236405 filed on Dec. 8, 2017, the entire contents of which are incorporated herein by reference.

BACKGROUND ART

Japanese Patent Laying-Open No. 2014-210690 (PTL 1) describes performing chemical mechanical polishing on a silicon carbide single-crystal substrate.

CITATION LIST

Patent Literature

PTL 1: Japanese Patent Laying-Open No. 2014-210690

SUMMARY OF INVENTION

A silicon carbide substrate according to the present disclosure includes a first main surface and a second main surface opposite to the first main surface, and is made of silicon carbide having a polytype of 4H. The first main surface has a maximum diameter not less than 140 mm. The silicon carbide substrate has a thickness not less than 300 μm and not more than 600 μm. The first main surface is a {0001} plane or a plane inclined at an off angle more than 0° and not more than 8° relative to the {0001} plane. Mathematical expressions 1 to 3 are satisfied, where $\nu_0$ represents a wave number indicating a peak corresponding to a folded mode of a longitudinal optical branch of a Raman spectrum of silicon carbide having a polytype of 4H and having zero stress, $\nu_{max}$ represents a maximum value of a wave number indicating a peak corresponding to a folded mode of a longitudinal optical branch of a Raman spectrum of the silicon carbide substrate in a region from the first main surface to the second main surface, $\nu_{min}$ represents a minimum value of the wave number indicating the peak corresponding to the folded mode of the longitudinal optical branch of the Raman spectrum of the silicon carbide substrate in the region from the first main surface to the second main surface, and $\nu_1$ represents a wave number indicating a peak corresponding to a folded mode of a longitudinal optical branch of a Raman spectrum of the silicon carbide substrate at the first main surface.

$\nu_{max} \leq \nu_0 + 0.05$ (unit: $cm^{-1}$)   Mathematical Expression 1

$\nu_{min} \geq \nu_0 0.05$ (unit: $cm^{-1}$)   Mathematical Expression 2

$\nu_0 - 0.02 \leq \nu_1 \leq \nu_0 + 0.035$ (unit: $cm^{-1}$)   Mathematical Expression 3

DETAILED DESCRIPTION

Figure 1:
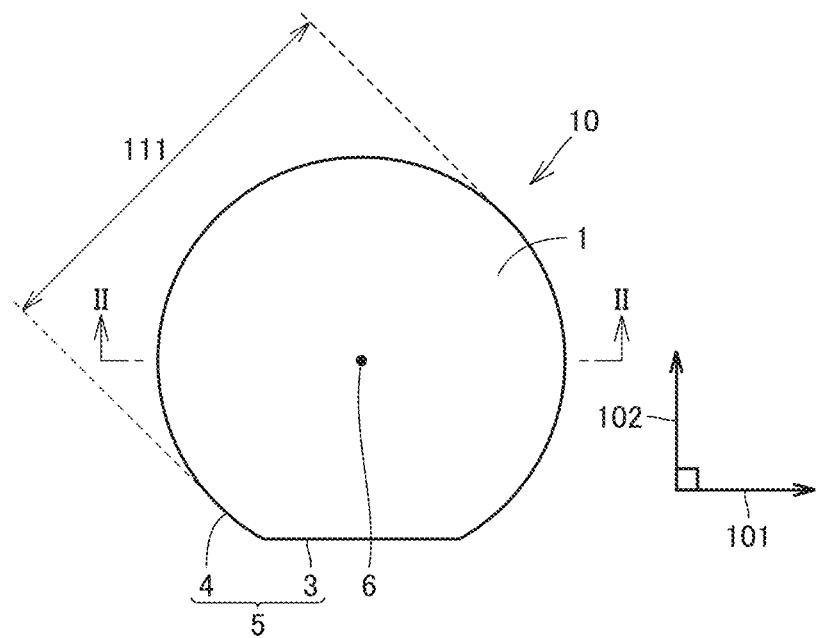
FIG. 1 is a schematic plan view showing the structure of a silicon carbide substrate according to the present embodiment.

[Problem to be Solved by the Present Disclosure]

An object of the present disclosure is to reduce variation in warpage of a silicon carbide substrate before and after the formation of a silicon carbide epitaxial layer.

[Advantageous Effect of the Present Disclosure]

According to the present disclosure, variation in warpage of a silicon carbide substrate before and after the formation of a silicon carbide epitaxial layer can be reduced.

[Description of Embodiment of the Present Disclosure]

(1) A silicon carbide substrate 10 according to the present disclosure includes a first main surface 1 and a second main surface 2 opposite to first main surface 1, and is made of silicon carbide having a polytype of 4H. First main surface 1 has a maximum diameter 111 not less than 140 mm. Silicon carbide substrate 10 has a thickness not less than 300 μm and not more than 600 μm. First main surface 1 is a {0001} plane or a plane inclined at an off angle more than 0° and not more than 8° relative to the {0001} plane. Mathematical expressions 1 to 3 are satisfied, where $\nu_0$ represents a wave number indicating a peak corresponding to a folded mode of a longitudinal optical branch of a Raman spectrum of silicon carbide having a polytype of 4H and having zero stress, $v_{max}$ represents a maximum value of a wave number indicating a peak corresponding to a folded mode of a longitudinal optical branch of a Raman spectrum of silicon carbide substrate 10 in a region from first main surface 1 to second main surface 2, $v_{min}$ represents a minimum value of the wave number indicating the peak corresponding to the folded mode of the longitudinal optical branch of the Raman spectrum of silicon carbide substrate 10 in the region from first main surface 1 to second main surface 2, and vi represents a wave number indicating a peak corresponding to a folded mode of a longitudinal optical branch of a Raman spectrum of silicon carbide substrate 10 at first main surface 1.

(2) In silicon carbide substrate 10 according to (1), a mathematical expression 4 may be satisfied at any position in a region of 3 μm or less from first main surface 1 toward second main surface 2, where v represents a wave number indicating a peak corresponding to a folded mode of a longitudinal optical branch of a Raman spectrum of silicon carbide substrate 10.

$v_0 - 0.02 \leq v \leq v_0 + 0.035$ (unit: cm$^{-1}$)     Mathematical Expression 4

(3) In silicon carbide substrate 10 according to (1) or (2), a mathematical expression 5 may be satisfied, where $\Delta_{max}$ represents a maximum value of a half-width of the peak corresponding to the folded mode of the longitudinal optical branch of the Raman spectrum of silicon carbide substrate 10 in the region from first main surface 1 to second main surface 2, and $\Delta_{min}$ represents a minimum value of the half-width of the peak corresponding to the folded mode of the longitudinal optical branch of the Raman spectrum of silicon carbide substrate 10 in the region from first main surface 1 to second main surface 2.

$\Delta_{max} - \Delta_{min} \leq 0.14$ (unit: cm$^{-1}$)     Mathematical Expression 5

[Details of Embodiment of the Present Disclosure]

An embodiment of the present disclosure is hereinafter described with reference to the drawings. The same or corresponding parts in the drawings below are designated by the same reference numbers and the description thereof will not be repeated. Regarding crystallographic denotation herein, an individual orientation, a group orientation, an individual plane, and a group plane are shown in [ ], < >, ( ) and { }, respectively. A crystallographically negative index is normally expressed by a number with a bar "–" thereabove, however, a negative sign herein precedes a number.

The configuration of a silicon carbide substrate 10 according to the present embodiment is initially described.

Figure 2:
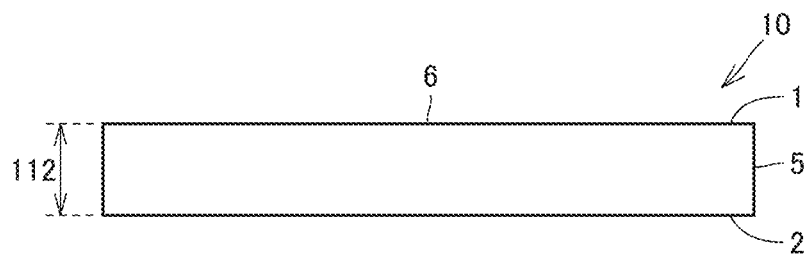
FIG. 2 is a schematic cross-sectional view taken along the line II-II in a direction of arrows in FIG. 1.

As shown in FIGS. 1 and 2, silicon carbide substrate 10 according to the present embodiment mainly includes a first main surface 1, a second main surface 2, and an outer circumferential surface 5. Second main surface 2 is opposite to first main surface 1. Silicon carbide substrate 10 is made of silicon carbide having a polytype of 4H. Silicon carbide substrate 10 contains an n type impurity such as nitrogen (N). Silicon carbide substrate 10 has n type conductivity, for example. A concentration of the n type impurity in silicon carbide substrate 10 is not less than $1 \times 10^{17}$ cm$^{-3}$ and not more than $1 \times 10^{20}$ cm$^{-3}$, for example.

As shown in FIG. 1, first main surface 1 has a maximum diameter 111 not less than 140 mm. Maximum diameter 111 of first main surface 1 may be, although not particularly limited to, not more than 160 mm, not more than 200 mm, not more than 250 mm, or not more than 300 mm, for example. As shown in FIG. 2, silicon carbide substrate 10 has a thickness 112 not less than 300 μm and not more than 600 μm. Thickness 112 of silicon carbide substrate 10 may be, although not particularly limited to, not less than 350 μm, or not less than 400 μm, for example. Thickness 112 of silicon carbide substrate 10 may be, although not particularly limited to, not more than 550 or not more than 500 μm, for example.

First main surface 1 is a {0001} plane or a plane inclined at an off angle more than 0° and not more than 8° relative to the {0001} plane. The off angle may be not less than 1°, or not less than 2°, for example. The off angle may be not more than 7°, or not more than 6°. Specifically, first main surface 1 may be a (0001) plane or a plane inclined at an off angle more than 0° and not more than 8° relative to the (0001) plane. First main surface 1 may be a (000-1) plane or a plane inclined at an off angle more than 0° and not more than 8° relative to the (000-1) plane. A direction of inclination of first main surface 1 is a <11-20> direction, for example.

As shown in FIG. 1, outer circumferential surface 5 may have a first flat 3 and an arc-shaped portion 4, for example. First flat 3 extends in a first direction 101, for example. Arc-shaped portion 4 is continuous to first flat 3. Outer circumferential surface 5 may have a second flat (not shown) extending in a second direction 102, for example. Second direction 102 is a <1-100> direction, for example. First direction 101 is a direction parallel to first main surface 1 and perpendicular to second direction 102. First direction 101 is the <11-20> direction, for example.

First main surface 1 is an epitaxial layer formation surface, for example. Stated from another perspective, a silicon carbide epitaxial layer 20 (see FIG. 12) is provided on first main surface 1. Second main surface 2 is a drain electrode formation surface, for example. Stated from another perspective, a drain electrode (not shown) of a metal oxide semiconductor field effect transistor (MOSFET) is formed on second main surface 2.

The configuration of a Raman spectroscopic apparatus for measuring a Raman spectrum of silicon carbide substrate 10 is now described.

Figure 3:
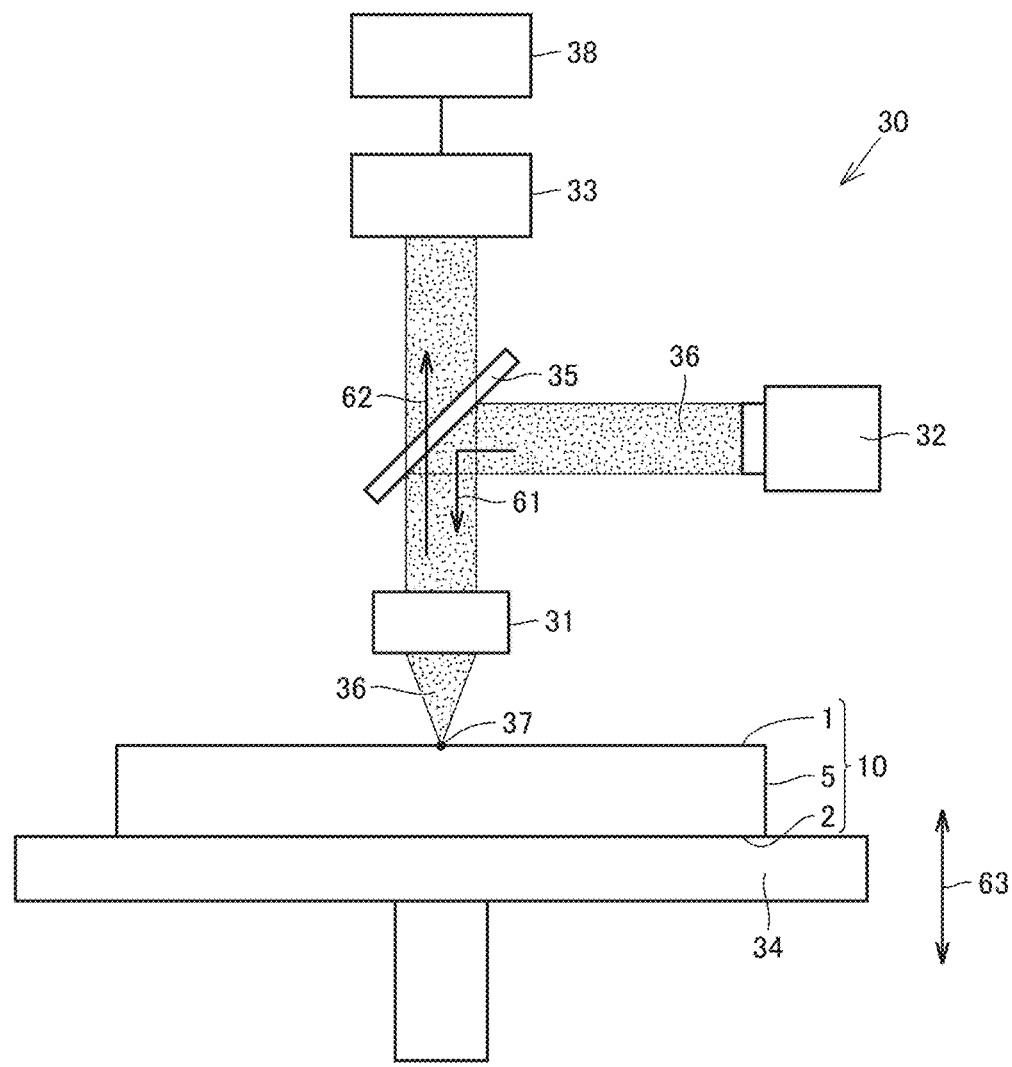
FIG. 3 is a schematic diagram showing the configuration of an apparatus for measuring a Raman spectrum.

As shown in FIG. 3, a Raman spectroscopic apparatus 30 mainly includes a light source 32, an objective lens 31, a spectroscope 33, a stage 34, a beam splitter 35, and a detector 38, for example. As Raman spectroscopic apparatus 30, LabRAM HR-800 provided by HORIBA JOBIN YVON can be used, for example. Light source 32 is an yttrium aluminum garnet (YAG) laser, for example. Light source 32 has an excitation wavelength of 532 nm, for example. Intensity of laser irradiation is 10 mW, for example. Backscattering measurement is used, for example, as a measurement method. Objective lens 31 has a magnification of 100×. A measurement area has a diameter of 1 μm, for example. A time of laser irradiation is 20 seconds, for example. The number of times of integration is 5, for example. A grating is 2400 gr/mm.

A method for measuring a Raman spectrum of silicon carbide substrate 10 is now described.

First, incident light 36 is emitted from the YAG laser of light source 32. As indicated by an arrow 61 in FIG. 3, incident light 36 is reflected off beam splitter 35 and emitted toward first main surface 1 of silicon carbide substrate 10. Raman spectroscopic apparatus 30 employs a confocal optical system, for example. In the confocal optical system, a confocal aperture (not shown) having a circular opening is disposed at a position conjugate to a focal point of objective lens 31. This allows detection of only light at a focused position (height).

As indicated by an arrow 62 in FIG. 3, Raman scattered light scattered by silicon carbide substrate 10 passes through beam splitter 35 and is introduced into spectroscope 33. In spectroscope 33, the Raman scattered light is resolved for each wave number. The Raman scattered light resolved for each wave number is detected by detector 38. A Raman spectrum with the wave number on the horizontal axis and intensity of the Raman scattered light on the vertical axis is thus obtained. Stage 34 is movable in a thickness direction of silicon carbide substrate 10 (direction of an arrow 63).

Figure 4:
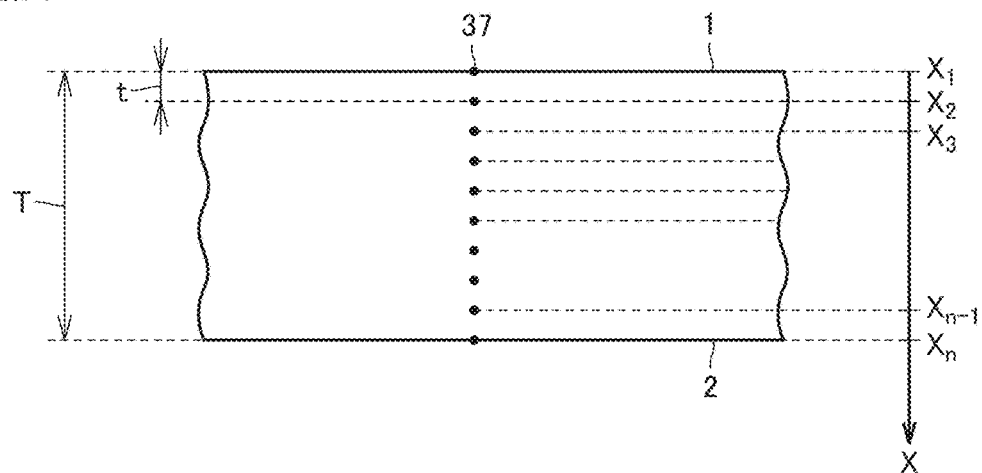
FIG. 4 is a schematic cross-sectional view showing a method for measuring a Raman spectrum.

As shown in FIG. 4, incident light 36 is focused on first main surface 1 of silicon carbide substrate 10, to measure a Raman spectrum in a measurement area 37. In this case, the focus position of incident light 36 in a height direction is a first position $X_1$. Incident light 36 is focused on a center 6 (see FIG. 1) of first main surface 1. Measurement area 37 for Raman scattered light is an area having a diameter of about 1 μm and including center 6 of first main surface 1. Stage 34 is then moved upward, to adjust the focus position of incident light 36 in the height direction to a second position $X_2$. A Raman spectrum at second position $X_2$ is thus measured. As described above, the Raman spectrum from each of first position $X_1$ to an nth position $X_n$ is measured by moving stage 34 in the direction of arrow 63. In other words, the Raman spectra are measured in the thickness direction of silicon carbide substrate 10.

Figure 5:
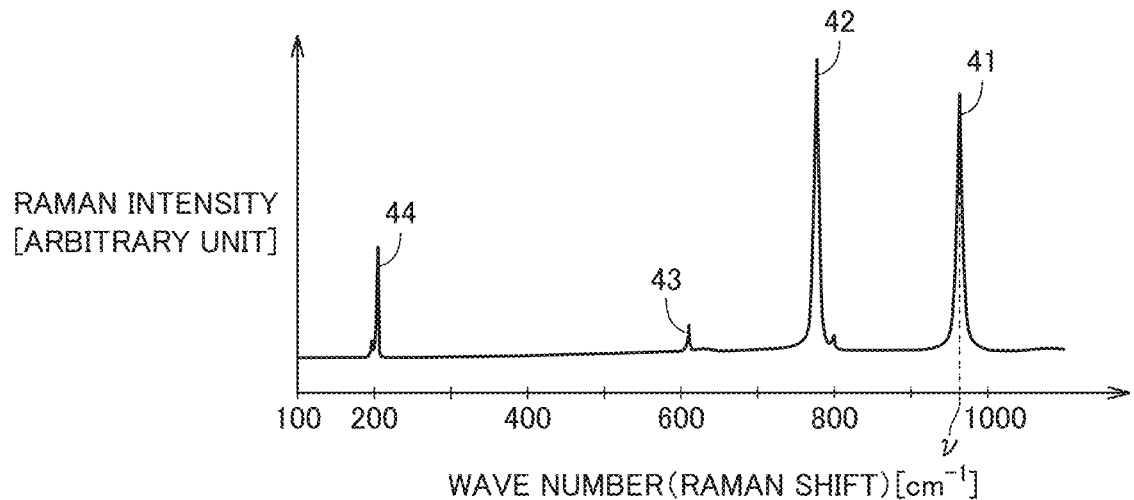
FIG. 5 shows an example of a Raman spectrum.

FIG. 5 shows an example of a Raman spectrum of silicon carbide substrate 10. The horizontal axis in FIG. 5 represents a wave number (Raman shift). The vertical axis in FIG. 5 represents intensity of Raman scattered light (Raman intensity). Excitation light of light source 32 has a wavelength of 514.5 nm. The Raman shift is the difference between a wave number of excitation light and a wave number of Raman scattered light in an object to be measured. When the object to be measured is silicon carbide having a polytype of 4H, mainly four peaks are observed in its Raman spectrum. A first peak 41 is Raman scattered light resulting from a folded mode of a longitudinal optical (LO) branch. First peak 41 appears around 964 $cm^{-1}$, for example. A second peak 42 is Raman scattered light resulting from a folded mode of a transverse optical (TO) branch. Second peak 42 appears around 776 $cm^{-1}$, for example. A third peak 43 is Raman scattered light resulting from a folded mode of a longitudinal acoustic (LA) branch. Third peak 43 appears around 610 $cm^{-1}$, for example. A fourth peak 44 is Raman scattered light resulting from a folded mode of a transverse acoustic (TA) branch. Fourth peak 44 appears around 196 $cm^{-1}$, for example.

Figure 6:
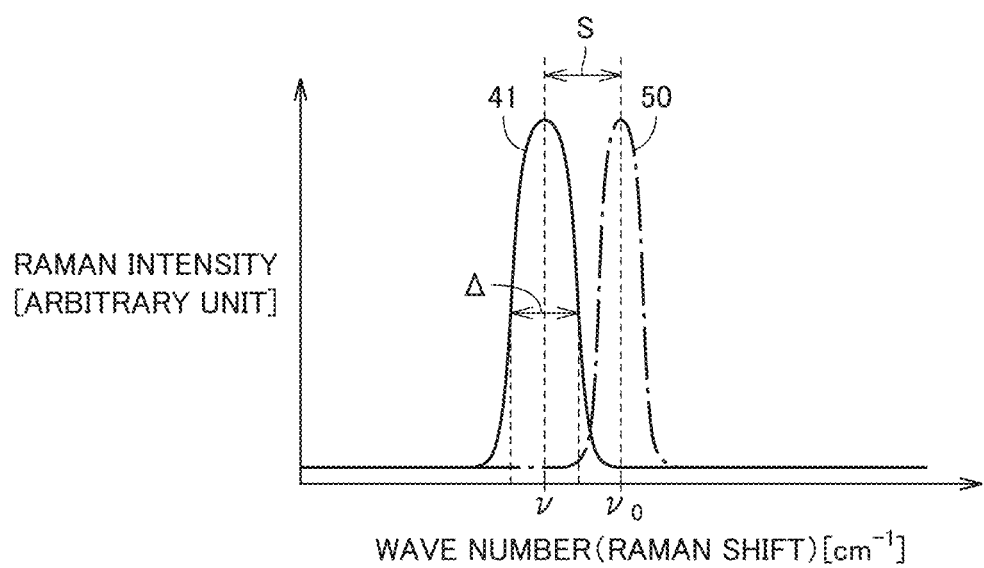
FIG. 6 shows an example of a Raman spectrum measured at a first position.

A Raman profile indicated by a solid line in FIG. 6 represents a Raman spectrum measured at first position $X_1$ (see FIG. 4) of silicon carbide substrate 10. This Raman spectrum is used to determine a wave number ν of peak 41 corresponding to the folded mode of the longitudinal optical branch. Likewise, a half-width Δ of peak 41 is determined. Peak 41 corresponding to the folded mode of the longitudinal optical branch is a peak of a Raman profile resulting from the folded mode of the longitudinal optical branch. A Raman profile 50 indicated by a chain-dotted line in FIG. 6 represents a peak corresponding to a folded mode of a longitudinal optical branch of a Raman spectrum of silicon carbide having a polytype of 4H and having zero stress. A wave number $ν_0$ of this peak can be determined as follows, for example. A peak of a Raman spectrum determined by Raman measurement of a Lely crystal (crystal grown with a Lely method) is set as wave number $ν_0$ with zero stress. The Lely crystal is grown by natural nucleation and includes only a small amount of impurity, and can thus be regarded as having zero stress.

Tensile stress or compressive stress occurs in the vicinity of first main surface 1 of silicon carbide substrate 10 after slicing. Thus, the wave number indicating the peak resulting from the folded mode of the longitudinal optical branch of the Raman profile measured at first position $X_1$ of silicon carbide substrate 10 shifts from wave number $ν_0$ indicating the peak corresponding to the folded mode of the longitudinal optical branch of the Raman spectrum of silicon carbide having a polytype of 4H and having zero stress. When tensile stress occurs in the measurement area, the wave number indicating the peak corresponding to the folded mode of the longitudinal optical branch of the Raman profile in the measurement area shifts negatively. Conversely, when compressive stress occurs in the measurement area, the wave number indicating the peak corresponding to the folded mode of the longitudinal optical branch of the Raman profile in the measurement area shifts positively. By determining a shift amount S in this manner, the stress in the measurement area can be quantitatively evaluated.

Figure 7:
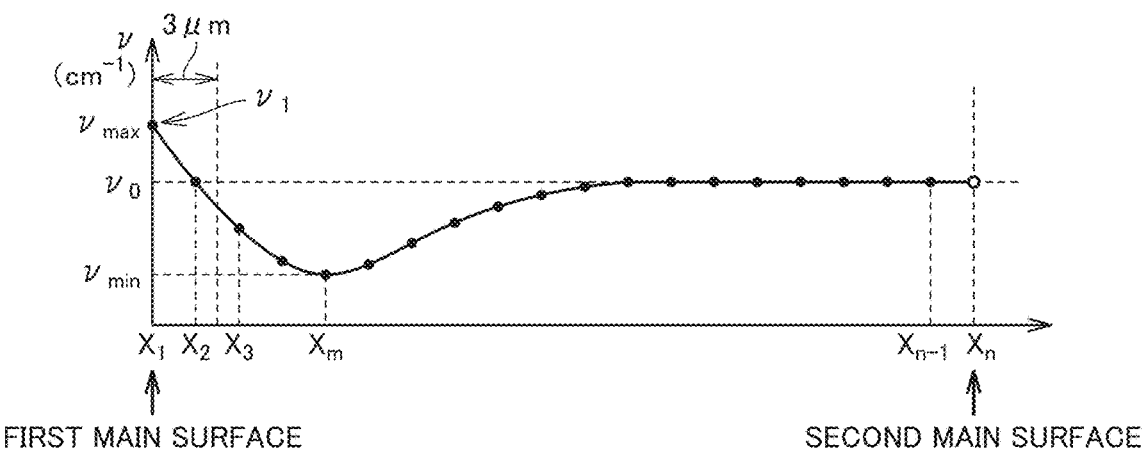
FIG. 7 shows relation between a wave number indicating a peak and a measurement position.

FIG. 7 is a diagram with a measurement position of silicon carbide substrate 10 plotted on the horizontal axis, and a wave number of a peak corresponding to a folded mode of a longitudinal optical branch of silicon carbide plotted on the vertical axis. As shown in FIG. 4, the measurement position of silicon carbide substrate 10 is varied by a constant interval t from first main surface 1 to second main surface 2. Interval t is 2.75 μm, for example. Specifically, a Raman spectrum of silicon carbide substrate 10 at first position $X_1$ is measured, and then a wave number of a peak corresponding to a folded mode of a longitudinal optical branch of this Raman spectrum is determined. Subsequently, a Raman spectrum of silicon carbide substrate 10 at second position $X_2$ is measured by moving stage 34 in the direction of arrow 63, and then a wave number of a peak corresponding to a folded mode of a longitudinal optical branch of this Raman spectrum is determined. Likewise, a Raman spectrum is measured from a third position $X_3$ to nth position $X_n$, and a wave number of a peak corresponding to a folded mode of a longitudinal optical branch of the Raman spectrum at each measurement position is determined. Relation between the wave number and the measurement position shown in FIG. 7 is determined as set forth above.

A maximum value of a wave number indicating a peak corresponding to a folded mode of a longitudinal optical branch of a Raman spectrum of silicon carbide substrate 10 in the region from first main surface 1 to second main surface 2 is determined as $ν_{max}$. In FIG. 7, the wave number at first position $X_1$ is $ν_{max}$. Likewise, a minimum value of the wave number indicating the peak corresponding to the folded mode of the longitudinal optical branch of the Raman spectrum of silicon carbide substrate 10 in the region from first main surface 1 to second main surface 2 is determined as $ν_{min}$. In FIG. 7, the wave number at an mth position $X_m$ is $ν_{min}$. A wave number indicating a peak corresponding to a folded mode of a longitudinal optical branch of a Raman spectrum of silicon carbide substrate 10 at first main surface 1 is determined as $ν_1$.

When $ν_0$ represents the peak wave number corresponding to the folded mode of the longitudinal optical branch of the Raman spectrum of silicon carbide having a polytype of 4H and having zero stress, $ν_{max}$ satisfies mathematical expression 1 above. In this case, $ν_{max}$ may be not more than ($ν_0$+0.045 $cm^{-1}$), or not more than ($ν_0$+0.04 $cm^{-1}$). In addition, $ν_{min}$ satisfies mathematical expression 2 above. In this case, $ν_{min}$ may be not less than ($ν_0$−0.045 $cm^{-1}$), or not less than ($ν_0$−0.04 $cm^{-1}$). In addition, $ν_1$ satisfies mathematical expression 3 above. In this case, $ν_1$ may be not less than ($v_0$−0.015 cm$^{-1}$), or not less than ($v_0$−0.01 cm$^{-1}$), and $v_1$ may be not more than ($v_0$+0.03 cm$^{-1}$), or not more than ($v_0$+0.025 cm$^{-1}$).

As shown in FIG. 7, the wave number indicating the peak corresponding to the folded mode of the longitudinal optical branch of the Raman profile measured at first position $X_1$ may be greater than wave number $v_0$. Silicon carbide substrate 10 may include a region (for example, from first position $X_1$ to mth position $X_m$) where the wave number indicating the peak corresponding to the folded mode of the longitudinal optical branch of the Raman profile decreases monotonously in a direction from first main surface 1 to second main surface 2. Silicon carbide substrate 10 may include a region (for example, from mth position $X_m$ to an n−1th position $X_{n−1}$) where the wave number indicating the peak corresponding to the folded mode of the longitudinal optical branch of the Raman profile increases monotonously in the direction from first main surface 1 to second main surface 2. The wave number indicating the peak corresponding to the folded mode of the longitudinal optical branch of the Raman profile may gradually approach wave number $v_0$ toward second main surface 2.

If second main surface 2 has high surface roughness, a large amount of noise is introduced into the Raman spectrum at second main surface 2, resulting in inability to correctly calculate the wave number indicating the peak corresponding to the folded mode of the longitudinal optical branch. In calculating the maximum value of the wave number and the minimum value of the wave number, therefore, the wave number indicating the peak corresponding to the folded mode of the longitudinal optical branch of the Raman spectrum at second main surface 2 is not taken into account. In FIG. 7, the wave number of the measurement position (nth position $X_n$) at second main surface 2 is indicated by an open circle. This means that the wave number at nth position $X_n$ may be measured, but is not taken into account in calculating the maximum value of the wave number and the minimum value of the wave number.

As shown in FIG. 7, when $v$ represents a wave number indicating a peak corresponding to a folded mode of a longitudinal optical branch of a Raman spectrum of silicon carbide substrate 10, $v$ satisfies mathematical expression 4 above at any position in a region of 3 μm or less from first main surface 1 toward second main surface 2. Specifically, the wave number of the peak corresponding to the folded mode of the longitudinal optical branch of the Raman spectrum of silicon carbide substrate 10 at first position $X_1$, and the wave number of the peak corresponding to the folded mode of the longitudinal optical branch of the Raman spectrum of silicon carbide substrate 10 at second position $X_2$ satisfy mathematical expression 4 above. In this case, $v$ may be not less than ($v_0$−0.015 cm$^{-1}$), or not less than ($v_0$−0.01 cm$^{-1}$). In this case, $v$ may be not more than ($v_0$+0.03 cm$^{-1}$), or not more than ($v_0$+0.025 cm$^{-1}$).

Figure 8:
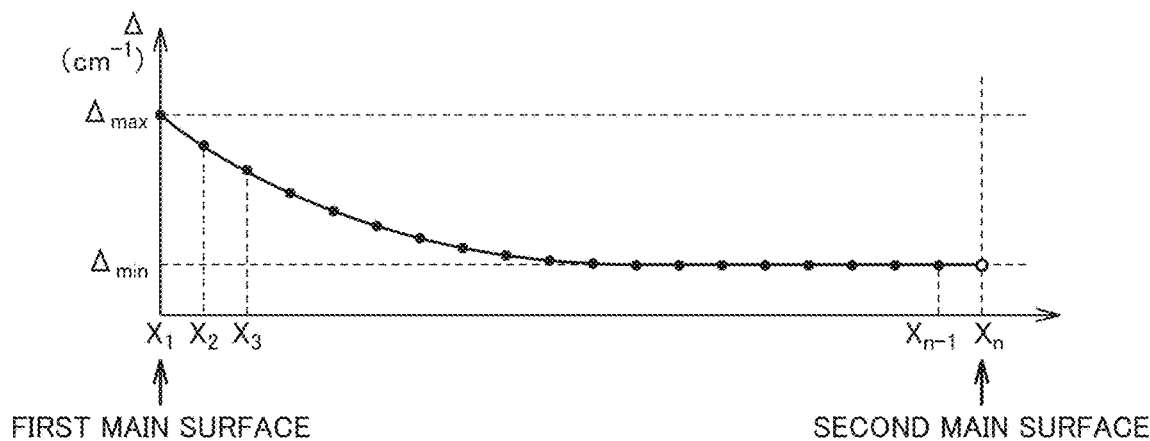
FIG. 8 shows relation between a half-width of the peak and the measurement position.

FIG. 8 is a diagram with the measurement position of silicon carbide substrate 10 plotted on the horizontal axis, and a half-width of the peak corresponding to the folded mode of the longitudinal optical branch of silicon carbide plotted on the vertical axis. As with FIG. 7, the measurement position of silicon carbide substrate 10 is varied by constant interval t from first main surface 1 to second main surface 2, to measure a Raman spectrum of silicon carbide substrate 10 at each measurement position. Half-width Δ of the peak corresponding to the folded mode of the longitudinal optical branch of the Raman spectrum at each measurement position is determined. Half-width Δ is specifically a full width at half maximum (FWHM). Relation between the half-width and the measurement position shown in FIG. 8 is determined as set forth above. The half-width of the peak is an indicator of stress distribution within a measurement area parallel to first main surface 1. The stress distribution in the measurement range decreases as the half-width of the peak decreases. Conversely, the stress distribution in the measurement range increases as the half-width of the peak increases.

A maximum value of the half-width of the peak corresponding to the folded mode of the longitudinal optical branch of the Raman spectrum of silicon carbide substrate 10 in the region from first main surface 1 to second main surface 2 is determined as $\Delta_{max}$. In FIG. 8, the half-width at first position $X_1$ is $\Delta_{max}$. Likewise, a minimum value of the half-width of the peak corresponding to the folded mode of the longitudinal optical branch of the Raman spectrum of silicon carbide substrate 10 in the region from first main surface 1 to second main surface 2 is determined as $\Delta_{min}$. In FIG. 8, the half-width at n−1th position $X_{n−1}$ is Δmin. In FIG. 8, the wave number of the measurement position (nth position $X_n$) at second main surface 2 is indicated by an open circle. This means that the half-width at nth position $X_n$ may be measured, but is not taken into account in calculating the maximum value of the half-width and the minimum value of the half-width.

As shown in FIG. 8, half-width Δ of the peak corresponding to the folded mode of the longitudinal optical branch of the Raman spectrum may decrease monotonously from first main surface 1 toward second main surface 2. Half-width Δ of the peak may gradually approach $\Delta_{min}$ toward second main surface 2. According to silicon carbide substrate 10 in the present embodiment, mathematical expression 5 above is satisfied, where $\Delta_{max}$ represents the maximum value of the half-width of the peak corresponding to the folded mode of the longitudinal optical branch of the Raman spectrum of silicon carbide substrate 10 in the region from first main surface 1 to second main surface 2, and $\Delta_{min}$ represents the minimum value of the half-width of the peak corresponding to the folded mode of the longitudinal optical branch of the Raman spectrum of silicon carbide substrate 10 in the region from first main surface 1 to second main surface 2. In this case, ($\Delta_{max}$-$\Delta_{min}$) may be not more than 0.13 cm$^{-1}$, or not more than 0.11 cm$^{-1}$.

Although the Raman profile has been described above as being measured along a straight line that passes through center 6 of first main surface 1 and that is substantially perpendicular to first main surface 1, the location of measurement of the Raman profile is not limited to this straight line. Mathematical expressions 1 to 5 may be satisfied, for example, in any region of silicon carbide substrate 10 excluding a region extending for a prescribed distance (for example, 3 mm) inward from outer circumferential surface 5.

A method for manufacturing silicon carbide substrate 10 according to the present embodiment is now described.

First, a slicing step is performed. Specifically, an ingot made of a silicon carbide single crystal having a polytype of 4H is formed by sublimation, for example. The ingot is shaped and then sliced by a wire saw device. Silicon carbide substrate 10 is thus cut from the ingot. Diamond abrasive grains are fixed to a surface of the saw wire. The diamond abrasive grains have a diameter not less than 15 μm and not more than 25 μm, for example. The saw wire has a diameter of 120 μm, for example. The saw wire has a linear speed not less than 800 m/min and not more than 1500 m/min, for example. The saw wire has a tension of 18 N, for example.

Silicon carbide substrate 10 is made of hexagonal silicon carbide having a polytype of 4H. Silicon carbide substrate 10 has first main surface 1, and second main surface 2 opposite to first main surface 1. First main surface 1 is a plane angled off by not more than 4° in a <11-20> direction relative to a {0001} plane, for example. Specifically, first main surface 1 is a plane angled off by not more than about 4° relative to a (0001) plane, for example. Second main surface 2 is a plane angled off by not more than about 4° in the <11-20> direction relative to a (000-1) plane, for example.

Figure 9:
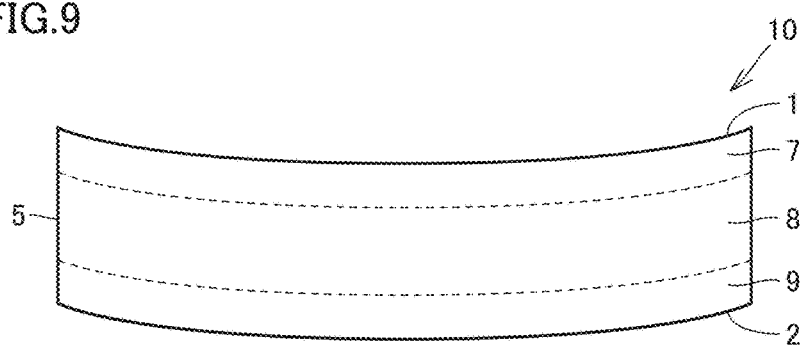
FIG. 9 is a schematic cross-sectional view showing a first step of a method for manufacturing the silicon carbide substrate according to the present embodiment.
Figure 10:
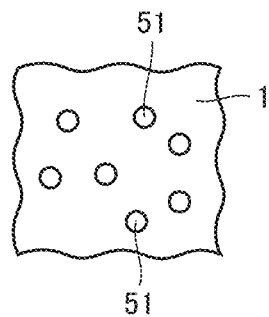
FIG. 10 is a schematic plan view showing the first step of the method for manufacturing the silicon carbide substrate according to the present embodiment.

As shown in FIG. 9, silicon carbide substrate 10 includes a first region 7, an intermediate region 8, and a second region 9. First region 7 is a region including first main surface 1. Second region 9 is a region including second main surface 2. Intermediate region 8 is a region between first region 7 and second region 9. In the slicing step described above, processing damage is caused to each of first region 7 and second region 9. This causes each of first region 7 and second region 9 to be warped more than intermediate region 8. First main surface 1 is curved such that, for example, its center is closer to second main surface 2 and its outer circumference is further from second main surface 2. Second main surface 2 is curved such that, for example, its center is further from first main surface 1 and its outer circumference is closer to first main surface 1. As shown in FIG. 10, on first main surface 1 of silicon carbide substrate 10, distortion regions 51 each having a substantially circular shape may be scattered as seen in a direction perpendicular to first main surface 1. The distortion region is a region where the processing damage remains. Distortion region 51 differs in stress from a region around distortion region 51.

Figure 11:
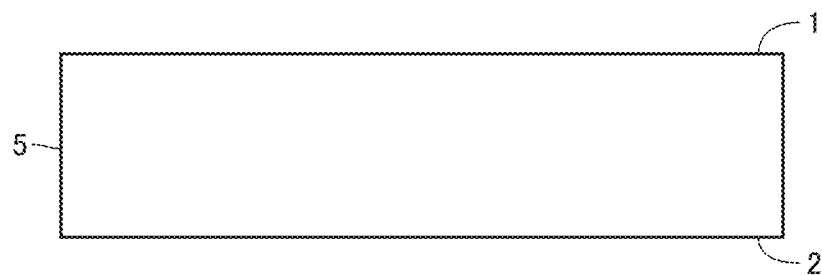
FIG. 11 is a schematic cross-sectional view showing a second step of the method for manufacturing the silicon carbide substrate according to the present embodiment.

Next, a first etching step is performed. Specifically, silicon carbide substrate 10 is etched by immersion of the entire silicon carbide substrate 10 in an etching solution prepared by mixing potassium hydroxide (KOH), potassium permanganate ($KMnO_4$) and pure water. The etching solution has a volume ratio of KOH:$KMnO_4$:pure water=5 to 15:1 to 3:20 to 30. The etching solution is at a temperature not less than 70° C. and not more than 95° C., for example. Then, silicon carbide substrate 10 is etched by immersion of the entire silicon carbide substrate 10 in an etching solution prepared by mixing hydrofluoric acid (HF) and nitric acid ($HNO_3$). The etching solution has a volume ratio of HF:$HNO_3$=3 to 5:2 to 4 (HF having a higher volume than $HNO_3$). The etching solution is at a temperature not less than 70° C. and not more than 95° C., for example. A surface of silicon carbide substrate 10 is thus etched not less than about 1 μm and not more than about 5 μm. The first etching reduces the stress distribution in the thickness direction of silicon carbide substrate 10. As a result, the warpage of silicon carbide substrate 10 is reduced (see FIG. 11). First main surface 1 is now substantially parallel to second main surface 2.

Next, a double-side mechanical polishing step is performed. Specifically, silicon carbide substrate 10 is disposed between a first surface plate (not shown) and a second surface plate (not shown) such that first main surface 1 faces the first surface plate and second main surface 2 faces the second surface plate. Slurry is then introduced between first main surface 1 and the first surface plate, and between second main surface 2 and the second surface plate. The slurry includes diamond abrasive grains, for example. The diamond abrasive grains have a diameter not less than 1 μm and not more than 3 μm, for example. With a load applied to first main surface 1 by the first surface plate and a load applied to second main surface 2 by the second surface plate, mechanical polishing is performed on both sides of silicon carbide substrate 10.

Next, a second etching step is performed. Specifically, silicon carbide substrate 10 is etched by immersion of the entire silicon carbide substrate 10 in an etching solution prepared by mixing potassium hydroxide (KOH), potassium permanganate ($KMnO_4$) and pure water. The etching solution has a volume ratio of KOH:$KMnO_4$:pure water=5 to 15:1 to 3:20 to 30. The etching solution is at a temperature not less than 70° C. and not more than 95° C., for example. Then, silicon carbide substrate 10 is etched by immersion of the entire silicon carbide substrate 10 in an etching solution prepared by mixing hydrofluoric acid (HF) and nitric acid ($HNO_3$). The etching solution has a volume ratio of HF:$HNO_3$=3 to 5:2 to 4 (HF having a higher volume than $HNO_3$). The etching solution is at a temperature not less than 70° C. and not more than 95° C., for example. A surface of silicon carbide substrate 10 is thus etched not less than about 1 μm and not more than about 5 μm. The second etching reduces the stress distribution in the thickness direction of silicon carbide substrate 10. As a result, the warpage of silicon carbide substrate 10 is reduced.

Next, first chemical mechanical polishing (CMP) is performed on first main surface 1 of silicon carbide substrate 10. Specifically, silicon carbide substrate 10 is held by a polishing head such that first main surface 1 faces the surface plate. Aluminum oxide is used as abrasive grains. The abrasive grains have an average particle size of 180 nm. A nitrate-based oxidizing agent is used as an oxidizing agent. A load (surface pressure) on silicon carbide substrate 10 is not less than 250 g/cm$^2$ and not more than 500 g/cm$^2$, for example. The surface plate has a rotational speed not less than 60 rpm and not more than 90 rpm, for example. The polishing head has a rotational speed not less than 80 rpm and not more than 120 rpm.

Next, second CMP is performed on first main surface 1 of silicon carbide substrate 10. Specifically, colloidal silica is used as abrasive grains. A hydrogen peroxide solution to which vanadate has been added is used as an oxidizing agent. A load (surface pressure) on silicon carbide substrate 10 is 300 g/cm$^2$, for example. The warpage of first main surface 1 of silicon carbide substrate 10 is thus reduced. Silicon carbide substrate 10 according to the present embodiment is manufactured as set forth above (see FIG. 1).

A method for forming a silicon carbide epitaxial layer on silicon carbide substrate 10 according to the present embodiment is now described.

Figure 12:
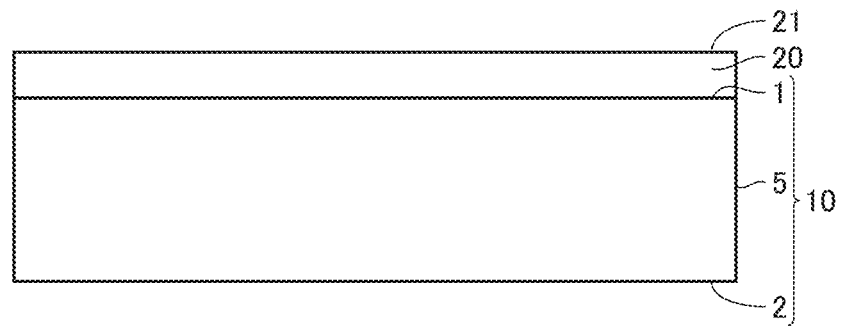
FIG. 12 is a schematic cross-sectional view showing a step of forming a silicon carbide epitaxial layer on the silicon carbide substrate according to the present embodiment.

Silicon carbide substrate 10 is disposed in a reaction chamber of a hot-wall type lateral chemical vapor deposition (CVD) apparatus, for example. Silicon carbide substrate 10 is then raised in temperature to about 1630° C., for example. Then, a mixed gas including silane ($SiH_4$), propane ($C_3H_8$), ammonia ($NH_3$) and hydrogen ($H_2$), for example, is introduced into the reaction chamber. Silicon carbide epitaxial layer 20 is thus formed on first main surface 1 of silicon carbide substrate 10 (see FIG. 12). As shown in FIG. 12, silicon carbide epitaxial layer 20 is in contact with first main surface 1. The silicon carbide epitaxial layer has a surface 21 facing first main surface 1. Silicon carbide epitaxial layer 20 has a thickness not less than 5 μm and not more than 100 μm, for example.

Functions and effects of silicon carbide substrate 10 according to the present embodiment will now be described.

When silicon carbide substrate 10 is subjected to processing such as slicing or mechanical polishing with diamond abrasive grains, processing damage is caused to silicon carbide substrate 10. Thus, in a region extending for from several tens of μm to several hundreds of μm inward from each of first main surface 1 and second main surface 2 of silicon carbide substrate 10, a region where distortion (stress) varies (specifically, first region 7 and second region 9) is formed. The region where distortion varies is believed to be formed by rolling of the diamond abrasive grains during the mechanical polishing. In a final state after the CMP, the distortion still exists in distortion regions 51 and regions around distortion regions 51 shown in FIG. 10. Deeper (stronger) distortion exists in distortion regions 51 than in the regions around distortion regions 51.

Hydrogen etching is performed on first main surface 1 of silicon carbide substrate 10, to remove a part of the region where distortion varies. This causes variation in stress distribution, and variation in shape of the warpage of silicon carbide substrate 10. A region where the stress distribution varies partially remains in silicon carbide substrate 10. The warpage varies from this point. Further, when silicon carbide substrate 10 is raised in temperature in order to form silicon carbide epitaxial layer 20 on silicon carbide substrate 10, the stress distribution varies in the region where the stress distribution varies that remains in silicon carbide substrate 10, causing larger variation in warpage of silicon carbide substrate 10. That is, the warpage of silicon carbide substrate 10 varies greatly before and after the formation of the silicon carbide epitaxial layer.

According to silicon carbide substrate 10 in the present embodiment, the region where distortion varies is mostly removed, to reduce the stress distribution in the thickness direction. Specifically, mathematical expressions 1 to 3 are satisfied, where $v_0$ represents the wave number indicating the peak corresponding to the folded mode of the longitudinal optical branch of the Raman spectrum of silicon carbide having a polytype of 4H and having zero stress, $v_{max}$ represents the maximum value of the wave number indicating the peak corresponding to the folded mode of the longitudinal optical branch of the Raman spectrum of silicon carbide substrate 10 in the region from first main surface 1 to second main surface 2, $v_{min}$ represents the minimum value of the wave number indicating the peak corresponding to the folded mode of the longitudinal optical branch of the Raman spectrum of silicon carbide substrate 10 in the region from first main surface 1 to second main surface 2, and $v_1$ represents the wave number indicating the peak corresponding to the folded mode of the longitudinal optical branch of the Raman spectrum of silicon carbide substrate 10 at first main surface 1. Thus, the variation in warpage of silicon carbide substrate 10 before and after the formation of the silicon carbide epitaxial layer can be reduced.

When the stress distribution is large in the thickness direction of silicon carbide substrate 10, linear stripes (protrusions) extending in a <1-100> direction may be formed on first main surface 1 of silicon carbide substrate 10, originating from distortion region 51, when silicon carbide substrate 10 is raised in temperature. When forming silicon carbide epitaxial layer 20 on silicon carbide substrate 10, the linear stripes formed on first main surface 1 of silicon carbide substrate 10 are transferred to silicon carbide epitaxial layer 20 formed on first main surface 1. As a result, the linear stripes are formed on surface 21 of silicon carbide epitaxial layer 20. In silicon carbide substrate 10 according to the present embodiment, the stress distribution is reduced in the thickness direction of silicon carbide substrate 10. Thus, the formation of linear stripes may be suppressed on surface 21 of silicon carbide epitaxial layer 20 formed on silicon carbide substrate 10.

EXAMPLE (Preparation of Samples)

Silicon carbide substrates 10 according to samples 1 to 4 were prepared through manufacturing processes described in Table 2. Silicon carbide substrate 10 according to sample 1 represented an example. Silicon carbide substrates 10 according to samples 2 to 4 represented comparative examples. Specifically, a silicon carbide ingot having a polytype of 4H was initially sliced by a wire saw device to cut silicon carbide substrate 10 from the ingot. Sample 1 was sliced using a condition A. Condition A for the slicing step was as follows. Diamond abrasive grains had a diameter not less than 15 μm and not more than 25 μm. The saw wire had a diameter of 120 μm. The saw wire had a linear speed not less than 800 m/min and not more than 1500 m/min. The saw wire had a tension of 18 N. Samples 2 to 4 were sliced using a condition B. Condition B for the slicing step was as follows. The diamond abrasive grains had a diameter not less than 30 μm and not more than 40 μm. The saw wire had a diameter of 180 μm. The saw wire had a linear speed not less than 800 m/min and not more than 1200 m/min. The saw wire had a tension of 45 N.

Then, a first etching step was performed on silicon carbide substrate 10 according to sample 1. A condition for the first etching step was as described above. The first etching step was not performed on silicon carbide substrates 10 according to samples 2 to 4.

Then, a double-side mechanical polishing step was performed on silicon carbide substrates 10 according to samples 1 to 4. A condition for the double-side mechanical polishing step was as described above.

Then, a second etching step was performed on silicon carbide substrate 10 according to sample 1. A condition for the second etching step was as described above. The second etching step was not performed on silicon carbide substrates 10 according to samples 2 to 4.

Then, a first CMP step was performed on silicon carbide substrates 10 according to samples 1 to 4. A condition C, a condition D, a condition E and a condition F were used for silicon carbide substrates 10 according to samples 1 to 4, respectively (see Table 1).

TABLE 1

|  | Condition C | Condition D | Condition E | Condition F |
|---|---|---|---|---|
| Abrasive grains | Aluminum oxide | Aluminum oxide | Aluminum oxide | Aluminum oxide |
| Average particle size of abrasive grains (nm) | 180 | 250 | 180 | 250 |
| Oxidizing agent | Nitrate-based oxidizing agent | Nitrate-based oxidizing agent | Nitrate-based oxidizing agent | Nitrate-based oxidizing agent |
| Load (surface pressure) (g/cm$^2$) | 250-500 | 250-500 | 600-700 | 500-600 |
| Rotational speed of surface plate (rpm) | 60-90 | 60-90 | 60-90 | 60-90 |
| Rotational speed of polishing head (rpm) | 80-120 | 80-120 | 80-120 | 80-120 |

Condition C for the first CMP step was as follows. Specifically, aluminum oxide was used as abrasive grains. The abrasive grains had an average particle size of 180 nm.

A nitrate-based oxidizing agent was used as an oxidizing agent. A load (surface pressure) on silicon carbide substrate 10 was not less than 250 g/cm² and not more than 500 g/cm². The surface plate had a rotational speed not less than 60 rpm and not more than 90 rpm. The polishing head had a rotational speed not less than 80 rpm and not more than 120 rpm.

Condition D for the first CMP step was as follows. Specifically, aluminum oxide was used as abrasive grains. The abrasive grains had an average particle size of 250 nm. A nitrate-based oxidizing agent was used as an oxidizing agent. A load (surface pressure) on silicon carbide substrate 10 was not less than 250 g/cm² and not more than 500 g/cm². The surface plate had a rotational speed not less than 60 rpm and not more than 90 rpm. The polishing head had a rotational speed not less than 80 rpm and not more than 120 rpm.

Condition E for the first CMP step was as follows. Specifically, aluminum oxide was used as abrasive grains. The abrasive grains had an average particle size of 180 nm. A nitrate-based oxidizing agent was used as an oxidizing agent. A load (surface pressure) on silicon carbide substrate 10 was not less than 600 g/cm² and not more than 700 g/cm². The surface plate had a rotational speed not less than 60 rpm and not more than 90 rpm. The polishing head had a rotational speed not less than 80 rpm and not more than 120 rpm.

Condition F for the first CMP step was as follows. Specifically, aluminum oxide was used as abrasive grains. The abrasive grains had an average particle size of 250 nm. A nitrate-based oxidizing agent was used as an oxidizing agent. A load (surface pressure) on silicon carbide substrate 10 was not less than 500 g/cm² and not more than 600 g/cm². The surface plate had a rotational speed not less than 60 rpm and not more than 90 rpm. The polishing head had a rotational speed not less than 80 rpm and not more than 120 rpm.

Then, a second CMP step was performed on silicon carbide substrates 10 according to samples 1 to 4. A condition for the second CMP step was as described above. Silicon carbide substrates 10 according to samples 1 to 4 were prepared as set forth above.

TABLE 2

| Sample No. | Slicing step | First etching step | Double-side mechanical polishing step | Second etching step | First CMP step | Second CMP step |
|---|---|---|---|---|---|---|
| Sample 1 | Condition A | Yes | Yes | Yes | Condition C | Yes |
| Sample 2 | Condition B | No | Yes | No | Condition D | Yes |
| Sample 3 | Condition B | No | Yes | No | Condition E | Yes |
| Sample 4 | Condition B | No | Yes | No | Condition F | Yes |

(Evaluation Method 1)

Figure 13:
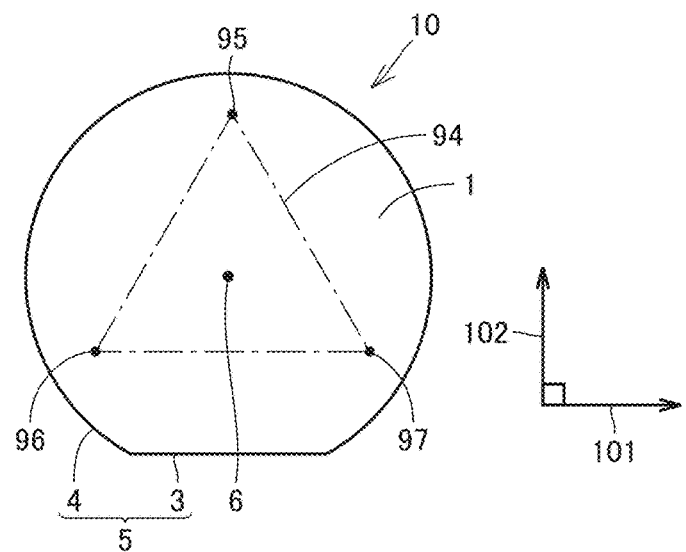
FIG. 13 is a schematic plan view showing a method for determining a three-point reference plane.

Next, warp and bow of first main surface 1 of silicon carbide substrates 10 according to samples 1 to 4 were measured. The warp and bow of first main surface 1 were measured with Flatmaster provided by Tropel. As shown in FIG. 13, a three-point reference plane 94 of first main surface 1 was determined. Three-point reference plane 94 is an imaginary plane including three points (a fifth position 95, a sixth position 96 and a seventh position 97) on first main surface 1. A triangle formed by connecting fifth position 95, sixth position 96 and seventh position 97 is a regular triangle including center 6 of first main surface 1 therein.

Figure 14:
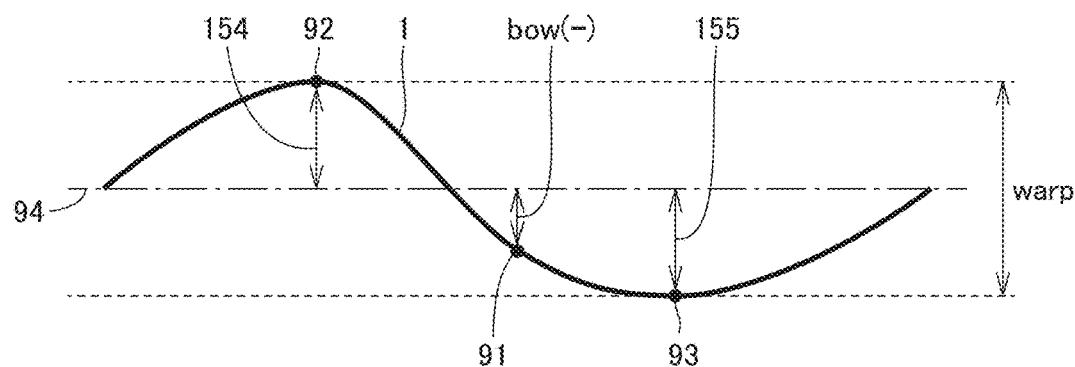
FIG. 14 is a first schematic diagram illustrating a method for measuring warp and bow.
Figure 15:
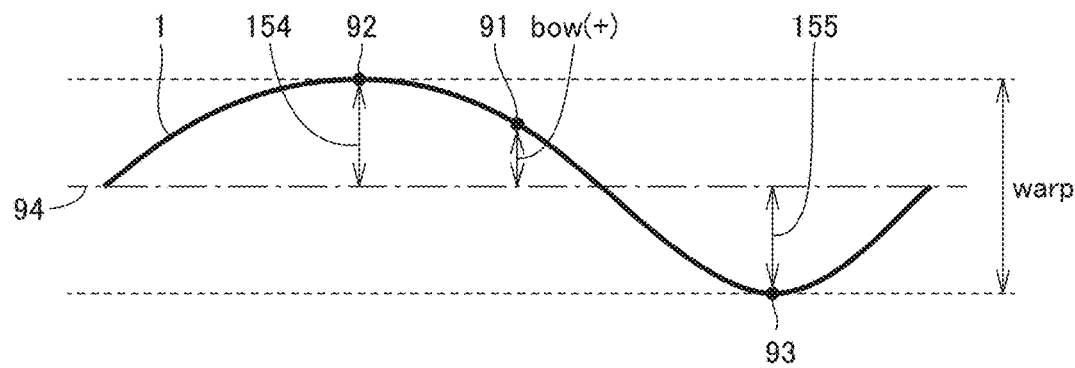
FIG. 15 is a second schematic diagram illustrating the method for measuring warp and bow.

As shown in FIGS. 14 and 15, in a direction perpendicular to three-point reference plane 94, the sum of a distance 154 between a highest position 92 of first main surface 1 as seen from three-point reference plane 94 and three-point reference plane 94, and a distance 155 between a lowest position 93 of first main surface 1 as seen from three-point reference plane 94 and three-point reference plane 94 represents the warp. As shown in FIGS. 14 and 15, in the direction perpendicular to three-point reference plane 94, a distance between a position 91 of center 6 of first main surface 1 and three-point reference plane 94 represents the bow. As shown in FIG. 14, when position 91 of center 6 of first main surface 1 is lower than three-point reference plane 94, the bow exhibits a negative value. As shown in FIG. 15, when position 91 of center 6 of first main surface 1 is higher than three-point reference plane 94, the bow exhibits a positive value.

(Evaluation Result 1)

As shown in Table 3, before epitaxial growth, the warp of first main surface 1 of silicon carbide substrates 10 according to samples 1 to 4 was 16.4 μm, 23.3 μm, 36.1 μm and 57.5 μm, respectively. The bow of first main surface 1 of silicon carbide substrates 10 according to samples 1 to 4 was −10.9 μm, 8.0 μm, 21.8 μm and −31.2 μm, respectively.

TABLE 3

| Sample No. | Before epitaxial growth | | After epitaxial growth | | Warp variation (μm) | Number of linear stripes |
|---|---|---|---|---|---|---|
| | Warp (μm) | Bow (μm) | Warp (μm) | Bow (μm) | | |
| Sample 1 | 16.4 | −10.9 | 12.3 | −7.8 | +4.1 | 0 |
| Sample 2 | 23.3 | 8.0 | 89.6 | −65.6 | −112.9 | 11 |
| Sample 3 | 36.1 | 21.8 | 64.3 | 48.9 | +28.2 | 2 |
| Sample 4 | 57.5 | −31.2 | 34.9 | −0.03 | +22.6 | 12 or more |

(Evaluation Method 2)

Raman spectroscopy was used to measure a Raman spectrum of silicon carbide substrate 10 in a region from first main surface 1 to second main surface 2 of silicon carbide substrates 10 according to samples 1 to 4. This Raman spectrum was used to determine relation between Δν(Ne) and a measurement position. Likewise, relation between a half-width (FWHM) of a peak and the measurement position was determined. In this case, Δν(Ne) is a value obtained by subtracting a wave number of a peak of a Raman spectrum of neon from a wave number of a peak corresponding to a folded mode of a longitudinal optical branch of silicon carbide having a polytype of 4H. Using the wave number indicating the peak of the Raman spectrum of neon as a reference, the wave number of the peak corresponding to the folded mode of the longitudinal optical branch of silicon carbide was determined. A direction of measurement of the peak corresponding to the folded mode of the longitudinal optical branch and the half-width of the peak was as described above. A value ($\Delta\nu(Ne)_0$) obtained by subtracting the wave number indicating the peak of the Raman spectrum of neon from the wave number indicating the peak corresponding to the folded mode of the longitudinal optical branch of the Raman spectrum of silicon carbide having a polytype of 4H and having zero stress was −44.25 cm⁻¹, for example. The measurement position was a distance from first main surface 1. The measurement position of first main surface 1 of silicon carbide substrate 10 was a position of 0 μm.

TABLE 4

| | Sample 1 | Sample 2 | Sample 3 | Sample 4 |
|---|---|---|---|---|
| $\|\Delta v(Ne)_{max} - \Delta v(Ne)_0\| = (v_{max} - v_0)$ (cm$^{-1}$) | 0.032 | 0.140 | 0.003 | 0.071 |
| $\|\Delta v(Ne)_{min} - \Delta v(Ne)_0\| = -(v_{min} - v_0)$ (cm$^{-1}$) | 0.046 | 0.069 | 0.061 | 0.028 |
| $\Delta v(Ne)$ at measurement position of 0 μm (cm$^{-1}$) | −44.218 | −44.110 | −44.247 | −44.179 |
| $\Delta v(Ne) - \Delta v(Ne)_0 = v_1 - v_0$ (cm$^{-1}$) | 0.032 | 0.140 | 0.003 | 0.071 |
| $\Delta_{max} - \Delta_{min}$ (cm$^{-1}$) | 0.10 | 0.15 | 0.18 | 0.22 |

(Evaluation Result 2)

Figure 16:
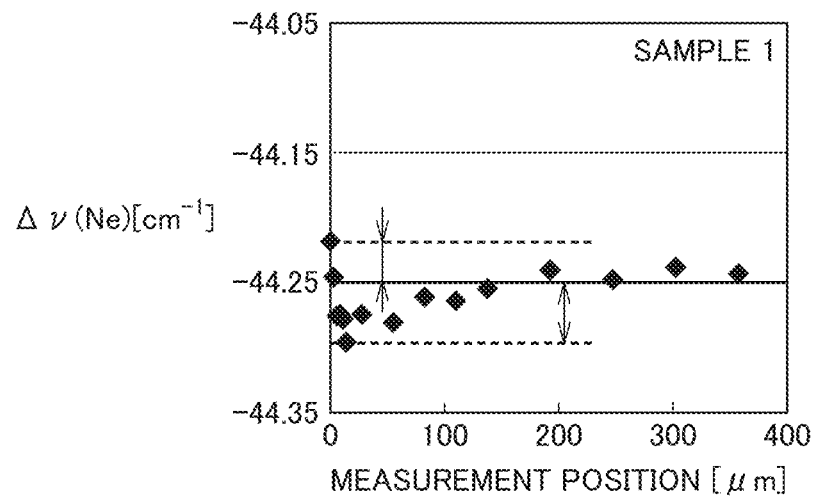
FIG. 16 shows relation between Δν(Ne) and a measurement position in sample 1.

As shown in FIG. 16 and Table 4, in silicon carbide substrate 10 according to sample 1, an absolute value of the difference between $\Delta v(Ne)_{max}$ and $\Delta v(Ne)_0$ was 0.032 cm$^{-1}$. An absolute value of the difference between $\Delta v(Ne)_{min}$ and $\Delta v(Ne)_0$ was 0.046 cm$^{-1}$. In this case, $\Delta v(Ne)$ at a measurement position of 0 μm was −44.218 cm$^{-1}$. A value obtained by subtracting $\Delta v(Ne)_0$ from $\Delta v(Ne)$ of first main surface 1 was 0.032 cm$^{-1}$.

Figure 17:
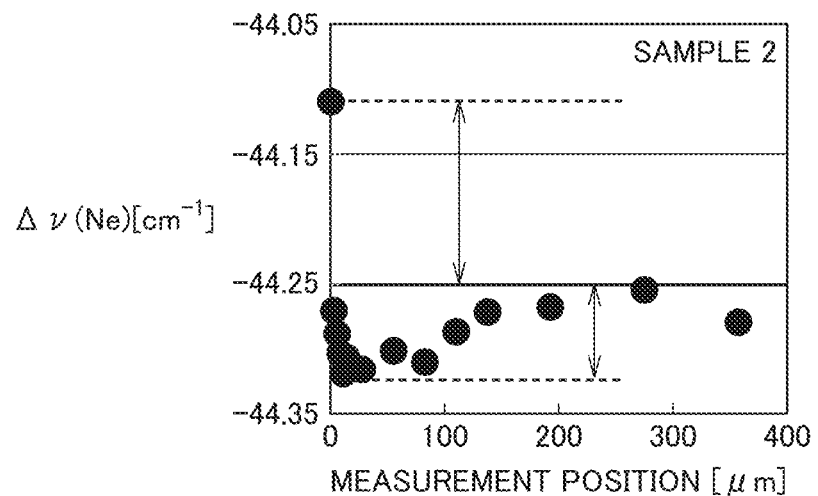
FIG. 17 shows relation between Δν(Ne) and a measurement position in sample 2.

As shown in FIG. 17 and Table 4, in silicon carbide substrate 10 according to sample 2, an absolute value of the difference between $\Delta v(Ne)_{max}$ and $\Delta v(Ne)_0$ was 0.140 cm$^{-1}$. An absolute value of the difference between $\Delta v(Ne)_{min}$ and $\Delta v(Ne)_0$ was 0.069 cm$^{-1}$. In this case, $\Delta v(Ne)$ at a measurement position of 0 μm was −44.110 cm$^{-1}$. A value obtained by subtracting $\Delta v(Ne)_0$ from $\Delta v(Ne)$ of first main surface 1 was 0.140 cm$^{-1}$.

Figure 18:
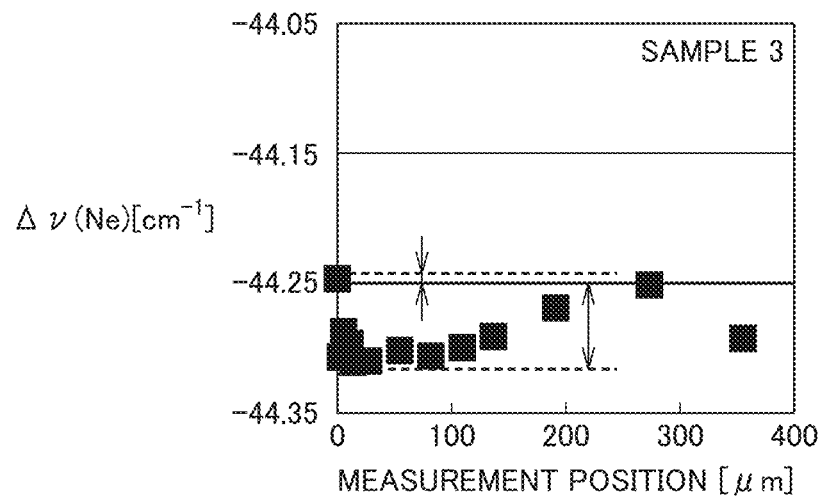
FIG. 18 shows relation between Δν(Ne) and a measurement position in sample 3.

As shown in FIG. 18 and Table 4, in silicon carbide substrate 10 according to sample 3, an absolute value of the difference between $\Delta v(Ne)_{max}$ and $\Delta v(Ne)_0$ was 0.003 cm$^{-1}$. An absolute value of the difference between $\Delta v(Ne)_{min}$ and $\Delta v(Ne)_0$ was 0.061 cm$^{-1}$. In this case, $\Delta v(Ne)$ at a measurement position of 0 μm was −44.247 cm$^{-1}$. A value obtained by subtracting $\Delta v(Ne)_0$ from $\Delta v(Ne)$ of first main surface 1 was 0.003 cm$^{-1}$.

Figure 19:
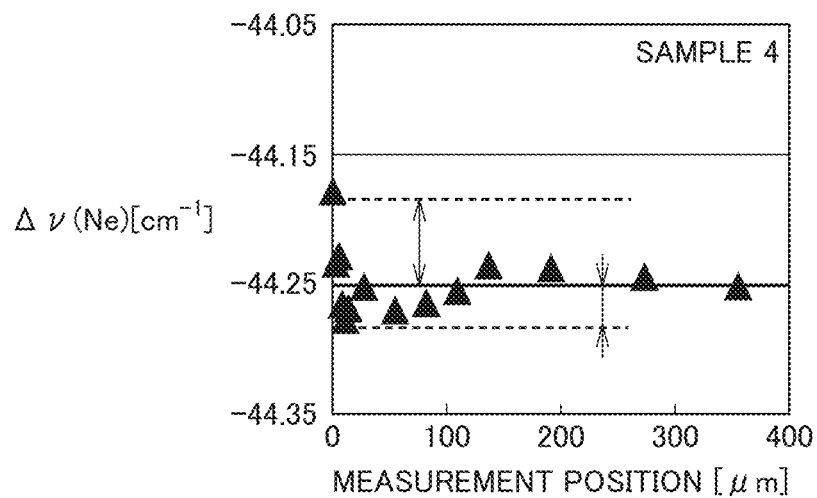
FIG. 19 shows relation between Δν(Ne) and a measurement position in sample 4.

As shown in FIG. 19 and Table 4, in silicon carbide substrate 10 according to sample 4, an absolute value of the difference between $\Delta v(Ne)_{max}$ and $\Delta v(Ne)_0$ was 0.071 cm$^{-1}$. An absolute value of the difference between $\Delta v(Ne)_{min}$ and $\Delta v(Ne)_0$ was 0.028 cm$^{-1}$. In this case, $\Delta v(Ne)$ at a measurement position of 0 μm was −44.179 cm$^{-1}$. A value obtained by subtracting $\Delta v(Ne)_0$ from $\Delta v(Ne)$ of first main surface 1 was 0.071 cm$^{-1}$.

Figure 20:
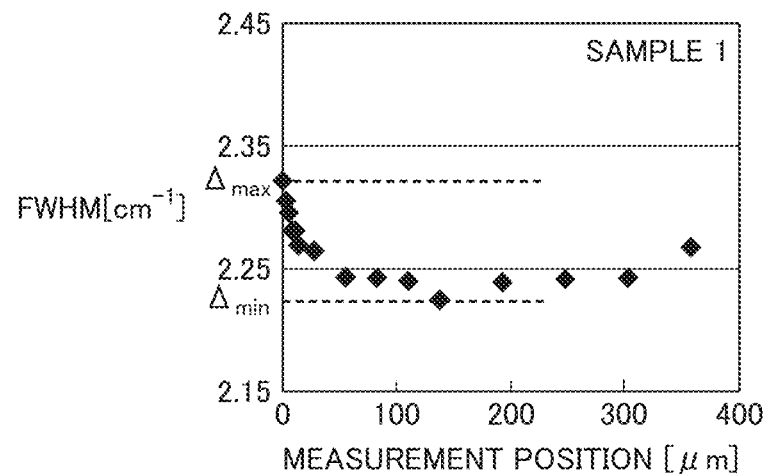
FIG. 20 shows relation between a FWHM and the measurement position in sample 1.
Figure 21:
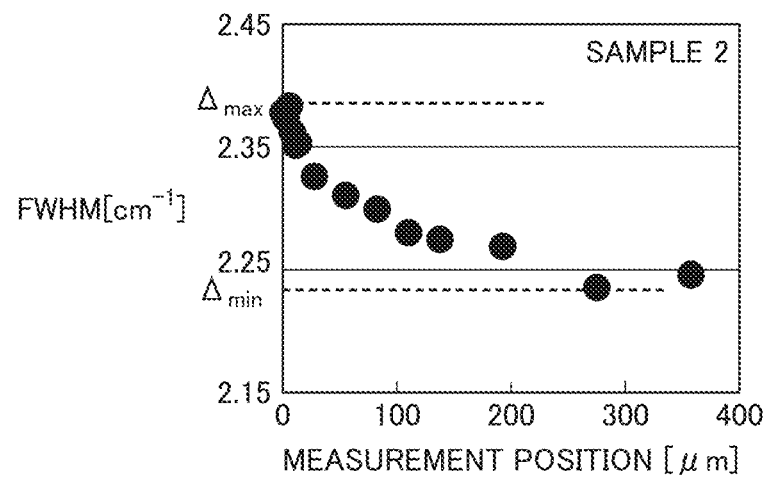
FIG. 21 shows relation between a FWHM and the measurement position in sample 2.

As shown in FIG. 20 and Table 4, in silicon carbide substrate 10 according to sample 1, a value obtained by subtracting $\Delta_{min}$ from $\Delta_{max}$ was 0.1 cm$^{-1}$. As shown in FIG. 21 and Table 4, in silicon carbide substrate 10 according to sample 2, a value obtained by subtracting $\Delta_{min}$ from $\Delta_{max}$ was 0.15 cm$^{-1}$.

Figure 22:
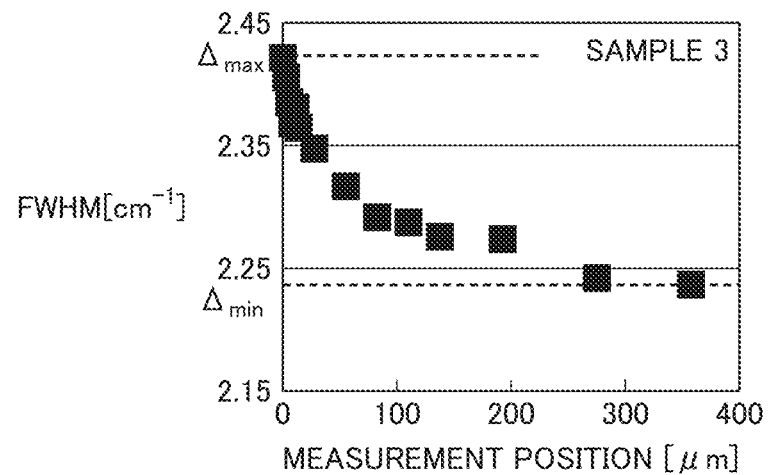
FIG. 22 shows relation between a FWHM and the measurement position in sample 3.
Figure 23:
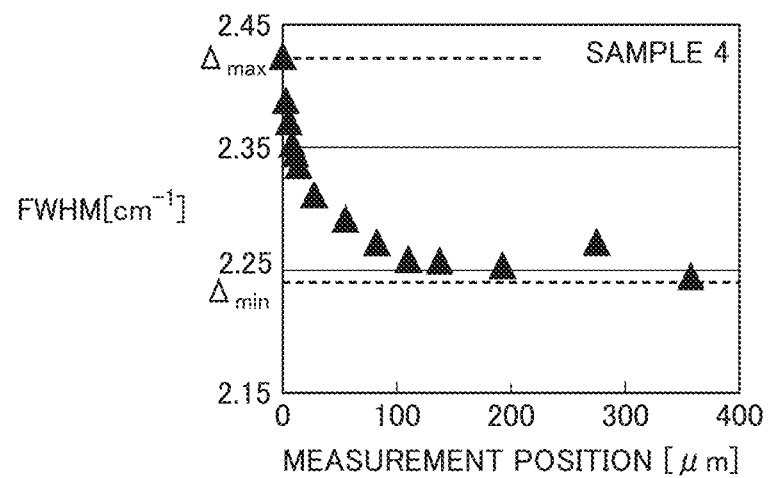
FIG. 23 shows relation between a FWHM and the measurement position in sample 4.

As shown in FIG. 22 and Table 4, in silicon carbide substrate 10 according to sample 3, a value obtained by subtracting $\Delta_{min}$ from $\Delta_{max}$ was 0.18 cm$^{-1}$. As shown in FIG. 23 and Table 4, in silicon carbide substrate 10 according to sample 4, a value obtained by subtracting $\Delta_{min}$ in from $\Delta_{max}$ was 0.22 cm$^{-1}$.

Then, silicon carbide epitaxial layer 20 was formed by epitaxial growth on first main surface 1 of silicon carbide substrates 10 according to samples 1 to 4, to manufacture a silicon carbide epitaxial substrate. A manufacturing condition for the silicon carbide epitaxial substrate was as described above.

(Evaluation Method 3)

Next, warp and bow of surface 21 of silicon carbide epitaxial layer 20 formed on silicon carbide substrates 10 according to samples 1 to 4 were measured. The warp and bow of surface 21 were measured with Flatmaster provided by Tropel as in the method described above.

The number of linear stripes on surface 21 of silicon carbide epitaxial layer 20 formed on silicon carbide substrates 10 according to samples 1 to 4 was also measured. A measurement area was a 250 μm×250 μm square region. A linear protrusion having a height of not less than 0.5 μm was identified as a stripe.

(Evaluation Result 3)

As shown in Table 3, after epitaxial growth, the warp of surface 21 of silicon carbide epitaxial layer 20 formed on silicon carbide substrates 10 according to samples 1 to 4 was 12.3 μm, 89.6 μm, 64.3 μm and 34.9 μm, respectively. The bow of surface 21 of the silicon carbide epitaxial layer formed on silicon carbide substrates 10 according to samples 1 to 4 was −7.8 μm, −65.6 μm, 48.9 μm and −0.03 μm, respectively. Variation in warp before and after the formation of the silicon carbide epitaxial layer on silicon carbide substrate 10 was +4.1 μm, −112.9 μm, +28.2 μm and +22.6 μm. The variation in warp before and after the formation of the silicon carbide epitaxial layer on silicon carbide substrate 10 was determined by applying the sign of the bow to the warp, and subtracting the warp of first main surface 1 before epitaxial growth from the warp of surface 21 after epitaxial growth.

As shown in Table 3, the number of linear stripes formed on surface 21 of the silicon carbide epitaxial layer formed on silicon carbide substrates 10 according to samples 1 to 4 was 0, 11, 2 and a multitude (12 or more).

It was confirmed from the above results that silicon carbide substrate 10 according to sample 1 can reduce the variation in warp as compared to silicon carbide substrates 10 according to samples 2 to 4. It was also confirmed that silicon carbide substrate 10 according to sample 1 can suppress the occurrence of linear stripes as compared to silicon carbide substrates 10 according to samples 2 to 4.

It should be understood that the embodiment and example disclosed herein are illustrative and non-restrictive in every respect. The scope of the present invention is defined by the terms of the claims rather than the description above, and is intended to include any modifications within the scope and meaning equivalent to the terms of the claims.

REFERENCE SIGNS LIST 1 first main surface; 2 second main surface; 3 first flat; 4 arc-shaped portion; 5 outer circumferential surface; 6 center; 7 first region; 8 intermediate region; 9 second region; 10 silicon carbide substrate; 20 silicon carbide epitaxial layer; 21 surface; 30 Raman spectroscopic apparatus; 31 objective lens; 32 light source; 33 spectroscope; 34 stage; 35 beam splitter; 36 incident light; 37 measurement area; 38 detector;

41 first peak (peak); 42 second peak; 43 third peak; 44 fourth peak; 50 Raman profile; 51 distortion region; 91 position; 92 highest position; 93 lowest position; 94 three-point reference plane; 95 fifth position; 96 sixth position; 97 seventh position; 101 first direction; 102 second direction; 111 maximum diameter; 112 thickness.

The invention claimed is:

1. A silicon carbide substrate comprising a first main surface and a second main surface opposite to the first main surface, the silicon carbide substrate being made of silicon carbide having a polytype of 4H, the first main surface having a maximum diameter not less than 140 mm, the silicon carbide substrate having a thickness not less than 300 μm and not more than 600 μm, the first main surface being a {0001} plane or a plane inclined at an off angle more than 0° and not more than 8° relative to the {0001} plane, and mathematical expressions 1 to 3 being satisfied, where $v_0$ represents a wave number indicating a peak corresponding to a folded mode of a longitudinal optical branch of a Raman spectrum of silicon carbide having a polytype of 4H and having zero stress, $v_{max}$ represents a maximum value of a wave number indicating a peak corresponding to a folded mode of a longitudinal optical branch of a Raman spectrum of the silicon carbide substrate in a region from the first main surface to the second main surface, $v_{min}$ represents a minimum value of the wave number indicating the peak corresponding to the folded mode of the longitudinal optical branch of the Raman spectrum of the silicon carbide substrate in the region from the first main surface to the second main surface, and $v_1$ represents a wave number indicating a peak corresponding to a folded mode of a longitudinal optical branch of a Raman spectrum of the silicon carbide substrate at the first main surface $$v_{max} \leq v_0 + 0.05 \text{ (unit: cm}^{-1}\text{)} \quad \text{Mathematical Expression 1}$$

$$v_{min} \geq v_0 0.05 \text{ (unit: cm}^{-1}\text{)} \quad \text{Mathematical Expression 2}$$

$$v_0 - 0.02 \leq v_1 \leq v_0 + 0.035 \text{ (unit: cm}^{-1}\text{)} \quad \text{Mathematical Expression 3.}$$

2. The silicon carbide substrate according to claim 1, wherein a mathematical expression 4 is satisfied at any position in a region of 3 μm or less from the first main surface toward the second main surface, where v represents a wave number indicating a peak corresponding to a folded mode of a longitudinal optical branch of a Raman spectrum of the silicon carbide substrate $$v_0 - 0.02 \leq v \leq v_0 + 0.035 \text{ (unit: cm}^{-1}\text{)} \quad \text{Mathematical Expression 4.}$$

3. The silicon carbide substrate according to claim 1, wherein a mathematical expression 5 is satisfied, where $\Delta_{max}$ represents a maximum value of a half-width of the peak corresponding to the folded mode of the longitudinal optical branch of the Raman spectrum of the silicon carbide substrate in the region from the first main surface to the second main surface, and $\Delta_{min}$ represents a minimum value of the half-width of the peak corresponding to the folded mode of the longitudinal optical branch of the Raman spectrum of the silicon carbide substrate in the region from the first main surface to the second main surface $$\Delta_{max} - \Delta_{min} \leq 0.14 \text{ (unit: cm}^{-1}\text{)} \quad \text{Mathematical Expression 5.}$$

* * * * *